(12) United States Patent
Ardehali

(10) Patent No.: US 7,760,018 B2  
(45) Date of Patent: Jul. 20, 2010

(54) HIGH-EFFICIENCY SWITCHING POWER AMPLIFIERS WITH LOW HARMONIC DISTORTION

(75) Inventor: Mohammad Ardehali, Newport Beach, CA (US)

(73) Assignee: Tialinx, Inc., Irvine, CA (US)

( * ) Notice: Subject to any disclaimer, the term of this patent is extended or adjusted under 35 U.S.C. 154(b) by 0 days.

(21) Appl. No.: 12/347,923

(22) Filed: Dec. 31, 2008

(65) Prior Publication Data

US 2009/0167436 A1 Jul. 2, 2009

Related U.S. Application Data

(60) Provisional application No. 61/018,296, filed on Dec. 31, 2007.

(51) Int. Cl.  
*H03F 3/217* (2006.01)

(52) U.S. Cl. .............. 330/251; 330/207 A; 330/302

(58) Field of Classification Search ............ 330/251, 330/207 A, 302  
See application file for complete search history.

(56) References Cited

U.S. PATENT DOCUMENTS

| | | | |
|---|---|---|---|
| 6,236,274 B1 * | 5/2001 | Liu | 330/302 |
| 6,784,732 B2 * | 8/2004 | Hajimiri et al. | 330/251 |
| 6,977,546 B2 * | 12/2005 | Stapleton | 330/10 |
| 7,180,758 B2 * | 2/2007 | Lincoln et al. | 363/56.01 |
| 7,224,232 B2 * | 5/2007 | Paul et al. | 330/307 |
| 7,265,618 B1 * | 9/2007 | Meck | 330/251 |

\* cited by examiner

*Primary Examiner*—Patricia Nguyen  
(74) *Attorney, Agent, or Firm*—Haynes & Boone, LLP.

(57) ABSTRACT

In one embodiment, a switching power amplifier is provided that includes: a power switch coupled between a power supply node and ground, wherein the power switch is configured to be cycled on and off responsive to an input signal voltage; and a matching network coupled between a terminal of the power switch and an output node, wherein the matching network includes: a first capacitor coupled between the terminal of the power switch and ground; a second capacitor having a first terminal and an opposing second terminal, the second terminal being coupled to ground, the second capacitor having a greater capacitance than the first capacitor; and a second switch coupled between the first terminal of the second capacitor and the terminal of the power switch, the second switch being configured to be cycled on and off responsive to a switching signal voltage such that the second switch is turned on before the power switch is turned off and such that the second switch is turned off after a current through the power switch is substantially zero responsive to the turning off of the power switch.

17 Claims, 2 Drawing Sheets

HIGH-EFFICIENCY SWITCHING POWER AMPLIFIERS WITH LOW HARMONIC DISTORTION

RELATED APPLICATION

This application claims the benefit of U.S. Provisional Application No. 61/018,296, filed Dec. 31, 2007.

TECHNICAL FIELD

The present invention relates generally to amplifiers, and more particularly to a high efficiency switching power amplifier with low harmonic distortion.

BACKGROUND

Power amplifiers can be broadly classified into two categories, linear and non-linear, based upon the operation mode of the active elements they contain. Conventionally, the active elements are transistors although other active devices such as vacuum tubes have been used. In a linear amplifier, the active devices are maintained in a linear region of operation. Conversely, in a non-linear amplifier, the active devices are used as switches such that these amplifiers may also be denoted as "switch mode" or switching power amplifiers. Because a switch is ideally either fully on, with very low resistance (zero voltage across the switch) or fully off (zero current across the switch), the efficiency of switching power amplifiers is very good. In contrast, an active device in the linear region of operation is neither fully on nor fully off and it thus is always dissipating power through resistance to the resulting continual current flow. Switching power amplifiers are thus popular alternatives to linear amplifiers.

Although switching power amplifiers offer attractive power efficiencies, the behavior of their switches varies from the ideal zero voltage (when on) vs. zero voltage (when off) switch model. A real world switch requires some time to fully turn on/turn off and also has some appreciable resistance when fully on. Thus, switching power amplifiers are often configured to force the voltage across the switch to be effectively zero during the switching instances. Such modifications may be better understood with reference to FIG. 1, which illustrates a conventional switching power amplifier (SPA) 100. A transistor M1 is driven by a gate voltage Vin to switch on and off responsive to an input voltage Vin to be amplified by SPA 100. In this embodiment, M1 is an NMOS transistor although it will be appreciated that PMOS versions of SPA 100 may also be constructed as known in the amplifier arts. The drain of M1, denoted as node VA, couples to a power supply voltage node VCC through an inductor L1 that acts as an RF choke. Node VA also couples to an output node through a matching network 101 for supplying an output voltage Vout that represents the amplified version of input voltage Vin. Matching network 101 includes a capacitor C1 that couples between node VA and ground (VSS). A series connected RLC circuit 105 also couples between node VA and ground to complete matching network 101. RLC circuit 105 includes an inductor L2, a capacitor C2, and a resistor R1. The output voltage node is between capacitor C2 and resistor R1. Resistor R1 would thus be in parallel with a load for SPA 100 such that a conventional resistance for R1 would be 50 ohms.

To suppress non-idealities in the switching behavior of M1, matching network 101 functions to: (1) as M1 turns off, keep the voltage at node VA low long enough such that the current through M1 may drop to zero; and (2) as M1 turns on, keep the voltage at the node VA and its first derivative dVA/dt substantially at zero. The grounded capacitor C1 guarantees the first condition. Without capacitor C1, as the M1 turns off, the drain voltage VA would increase, introducing substantial power loss in transistor M1. To satisfy the second condition, the matching network consisting of C1, C2, L2, and R1 should operate as a damped second order system, with initial conditions across C1, C2, and L2. The first initial condition determines the value of C1 and the second initial condition determines the value of C2. But note that is conventional to drive M1 with a square wave input voltage Vin such that a resonant tank property of matching network 101 produces a corresponding sinusoidal output signal voltage Vout. A resonant circuit is resonant only at certain frequencies and is also characterized by a quality factor Q. Achieving a high resonant frequency and a high Q requires a relatively small capacitance in the resonant circuit. A high Q functions to reduce the harmonic distortion introduced in a sinusoidal output voltage Vout for SPA 100. Achieving low harmonic distortion in an SPA (such that its matching network has a relatively small capacitance) is thus at odds with minimizing switch non-idealities (which requires a relatively larger capacitance in the matching network).

Accordingly, there is a need in the art for a switching power amplifier that both minimizes harmonic distortion and suppresses switching non-idealities.

SUMMARY

In accordance with one aspect of the invention, a switching power amplifier is provided that includes: a power switch coupled between a power supply node and ground, wherein the power switch is configured to be cycled on and off responsive to an input signal voltage; and a matching network coupled between a terminal of the power switch and an output node, wherein the matching network includes: a first capacitor coupled between the terminal of the power switch and ground; a second capacitor having a first terminal and an opposing second terminal, the second terminal being coupled to ground, the second capacitor having a greater capacitance than the first capacitor; and a second switch coupled between the first terminal of the second capacitor and the terminal of the power switch, the second switch being configured to be cycled on and off responsive to a switching signal voltage such that the second switch is turned on before the power switch is turned off and such that the second switch is turned off after a current through the power switch is substantially zero responsive to the turning off of the power switch.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
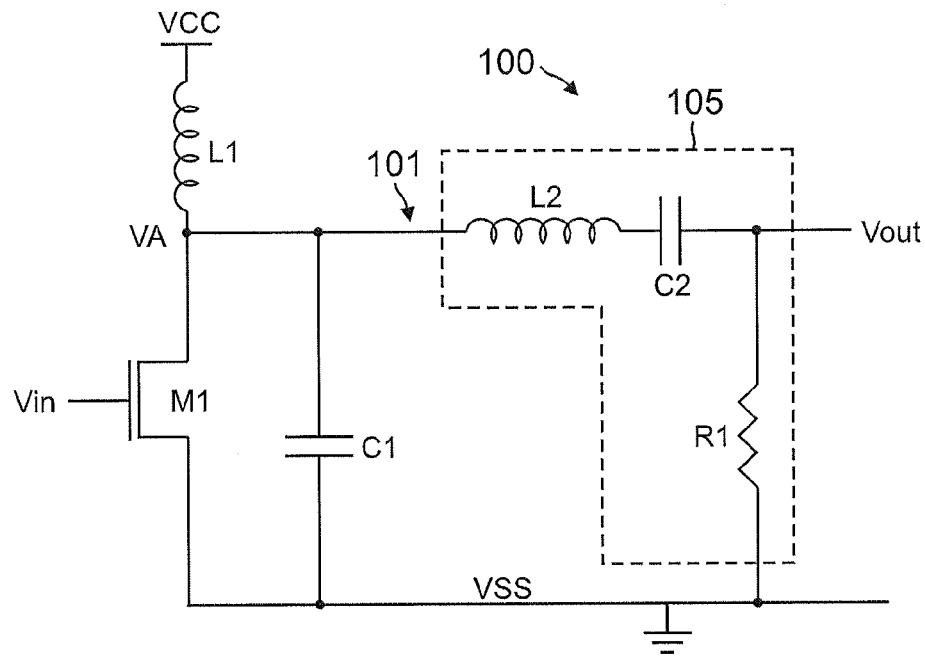
FIG. 1 is a circuit schematic for a conventional switching power amplifier.
Figure 2:
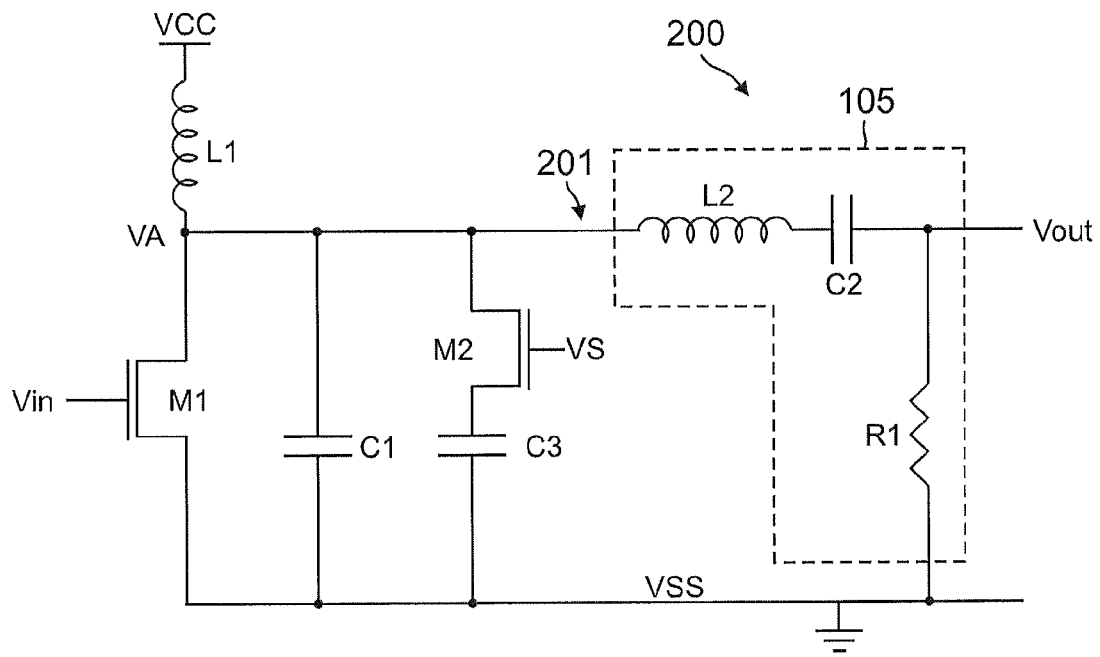
FIG. 2 is a circuit schematic for a switching power amplifier that reduces harmonic distortion while also suppressing switching non-idealities according to an embodiment of the invention.

A switching power amplifier (SPA) is disclosed that decouples the minimization of switch non-idealities with the minimization of harmonic distortion in the output signal. This decoupling may be better understood with reference to FIG. 2, which illustrates an example SPA 200. SPA 200 has a different matching network 201 as contrasted with matching network 101 of SPA 100. Both SPA 100 and SPA 200 share circuit elements M1, L1, C2, L2, and R1 as discussed with regard to FIG. 1. However, in matching network 201, a second transistor such as an NMOS transistor M2 has its drain coupling to node VA. The source of M2 couples to ground through a capacitor C3. These extra components provide the decoupling discussed above. In that regard, consider again the functions of matching network 201, which functions to: (1) as M1 turns off, keep the voltage at node VA low long enough such that the current through M1 may drop to zero; and (2) as M1 turns on, keep the voltage at the node VA and its first derivative dVA/dt substantially at zero. In addition, matching network 201 should also allow for a relatively high output frequency for output signal voltage Vout as well as providing a high Q to minimize harmonic distortion in output signal voltage Vout.

Figure 3:
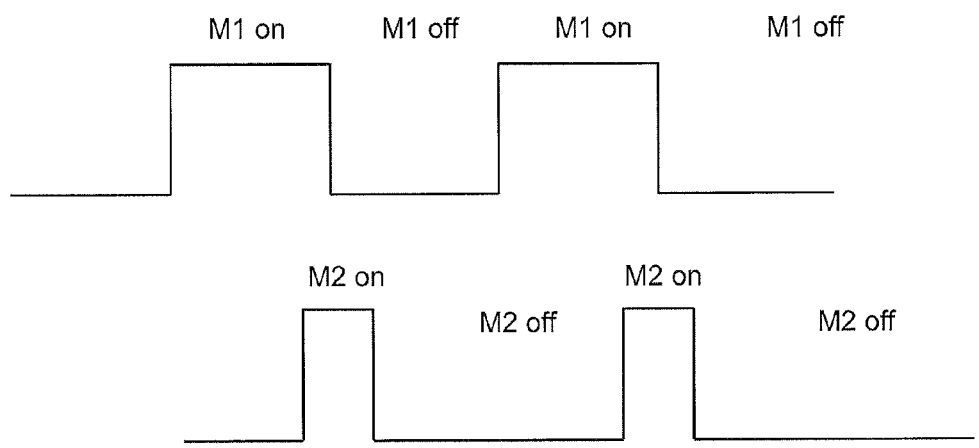
FIG. 3 illustrates the time waveforms for the drive signals to the switches in the switching power amplifier of FIG. 2.

C1 in SPA 100 must have a relatively large capacitance to satisfy condition 1. This relatively large capacitance is then at odds with achieving a high frequency for the output signal voltage Vout as well as achieving a high Q within the matching network. In contrast, C1 in SPA 200 may have a relatively small capacitance because it may be coupled in parallel with capacitor C3. C3 may thus provide the relatively large capacitance to pull output node VA to ground as switch M1 is turned off. To allow C1 and C3 to be so coupled, M2 is turned on through actuation of a drive signal Vs applied to the gate of M2 slightly before M1 is turned off such that the combined capacitance of C1 and C3 act to pull node VA to ground. To then alleviate this large capacitance so as to allow a high Q factor within matching network 201, M2 is turned off after the current through M1 has sufficiently dropped to zero. For example, if input signal voltage Vin is a square wave having a frequency of 1 GHz as shown in FIG. 3, the switching signal VS may be considered to have a square wave frequency of 10 GHz (with only every $10^{th}$ cycle of the 10 GHz signal actually being expressed). The oscillation of VS should be adjusted as shown in FIG. 3 such that the on period for M2 is roughly centered about the switch off time for M1.

It may be immediately appreciated that a designer of SPA 200 has an extra degree of freedom as opposed to that provided by SPA 100 in that condition (1) establishes the value of C1 for SPA 100. With C1 thus already determined, a designer of SPA 100 can only adjust C2 with regard to satisfying condition (2) while also attempting to achieve a high quality factor Q. In contrast, a designer of SPA 200 still has two degrees of freedom to satisfy condition (2), namely C1 and C2 in that C3 can be designed to satisfy condition (1). In this fashion, a designer of SPA 200 may achieve both the minimization of switching non-idealities while achieving a high quality factor Q so as to minimize harmonic distortion.

It will be obvious to those skilled in the art that various changes and modifications may be made without departing from this invention in its broader aspects. The appended claims encompass all such changes and modifications as fall within the true spirit and scope of this invention.

I claim:

1. A switching power amplifier comprising:
   a power switch coupled between a power supply node and ground, wherein the power switch is configured to be cycled on and off responsive to an input signal voltage; and
   a matching network coupled between a terminal of the power switch and an output node, wherein the matching network includes:
   a first capacitor coupled between the terminal of the power switch and ground;
   a second capacitor having a first terminal and an opposing second terminal, the second terminal being coupled to ground, the second capacitor having a greater capacitance than the first capacitor; and
   a second switch coupled between the first terminal of the second capacitor and the terminal of the power switch, the second switch being configured to be cycled on and off responsive to a switching signal voltage such that the second switch is turned on before the power switch is turned off and such that the second switch is turned off after a current through the power switch is substantially zero responsive to the turning off of the power switch.

2. The switching power amplifier of claim 1, wherein the matching network further includes:
   a series connected RLC circuit coupled between the terminal of the power switch and ground, so that a resonant tank property of the matching network produces an output signal voltage at the output node corresponding to the input signal voltage; and
   the first capacitor is small enough to allow a high Q factor for the matching network.

3. The switching power amplifier of claim 1, wherein:
   when turned on, the second switch couples the second capacitor in parallel with the first capacitor; and
   when turned off, the second switch decouples the greater capacitance of the second capacitor from the first capacitor.

4. The switching power amplifier of claim 1, wherein:
   when the second switch is turned on, the second capacitor is connected so as to pull down a voltage at the terminal of the power switch; and
   when the second switch is turned off, the second capacitor does not adversely affect a Q factor of the matching network.

5. The switching power amplifier of claim 1, further comprising an RF choke coupling the power switch to the power supply node.

6. A power amplifier, comprising:
a first transistor connected to a switch node and driven by an input voltage to switch on and off so that a voltage at the switch node goes low and high responsive to the input voltage;
a first capacitor connected between the switch node and ground;
a second capacitor connected to ground on one side and having a non-ground side;
a second transistor driven by a switching signal voltage and connected between the switch node and the non-ground side of the second capacitor so that when the second transistor is turned on by the switching signal voltage:
the first and second capacitors are connected in parallel between ground and the switch node; and
a series RLC circuit connected to the switch node and having an output voltage node so that when the second transistor is turned off by the switching signal voltage:
the second capacitor is disconnected from the series RLC circuit; and
an output voltage at the output voltage node is responsive to the input voltage dependent on the values of the first capacitor and the RLC circuit and independent of the value of the second capacitor.

7. The power amplifier of claim 6, wherein the switching signal voltage is applied such that:
the second transistor is turned on before the first transistor is turned off responsive to the input voltage, and
the second transistor is turned off after a current through the first transistor is substantially zero responsive to the turning off of the first transistor.

8. The power amplifier of claim 6, wherein
the first capacitor and the series RLC circuit act as a resonant circuit at the frequency of the input signal voltage;
the first capacitor is small enough to allow a high Q factor for the resonant circuit; and
the second capacitor is large enough so that as the first transistor turns off responsive to the input voltage, the voltage at the switch node is held low long enough for the first transistor current to drop substantially to zero.

9. The power amplifier of claim 6, wherein:
the first capacitor and the series RLC circuit act as a matching network so that a resonant tank property of the matching network at the frequency of the input signal voltage produces the output voltage at the output voltage node corresponding to the input signal voltage.

10. The power amplifier of claim 6, wherein:
the first capacitor and the series RLC circuit act as a matching network having a high Q factor such that, with the second transistor turned off and the second capacitor disconnected, as the first transistor turns on, the voltage at the switch node and the first time derivative of the voltage at the switch node are kept substantially zero.

11. A method of switching power amplification, the method comprising:
switching a power switch on and off in response to an input signal voltage, the power switch switching a voltage at a switch node between low and high according to the input signal voltage; and
switching a second switch on and off in response to a switching signal voltage such that the second switch is turned on before the power switch is turned off and such that the second switch is turned off after a current though the power switch is substantially zero responsive to the turning off of the power switch.

12. The method of claim 11, wherein:
switching the second switch on connects a capacitor between the switch node and ground; and
switching the second switch off disconnects the capacitor from the switch node.

13. The method of claim 11, further comprising:
providing an output signal at an output voltage node responsive to the input signal voltage using a resonant circuit connected to the switch node, and wherein:
switching the second switch off allows the resonant circuit to have a higher Q factor.

14. The method of claim 11, further comprising:
providing an output signal at an output voltage node responsive to the input signal voltage through a matching network connected to the switch node, and wherein:
switching the second switch off allows the matching network to provide the output signal with reduced harmonic distortion.

15. The method of claim 11, wherein the power switch is a first transistor coupled between the switch node and ground; and
the switching of the second switch on before the power switch is turned off connects a capacitor across the first transistor so that a voltage at the switch node remains low long enough after the first transistor is turned off such that the current through the first transistor becomes substantially zero responsive to the turning off of the first transistor.

16. The method of claim 11, further comprising:
providing an output signal at an output voltage node responsive to the input signal voltage through a matching network connected to the switch node, and wherein:
the matching network has a resonant tank property at approximately the frequency of the input signal voltage;
switching the second switch off allows the resonant tank property of the matching network to have a higher Q factor; and
switching the second switch off allows the matching network to provide the output signal with reduced harmonic distortion.

17. The method of claim 11, further comprising:
providing an output signal at an output voltage node responsive to the input signal voltage though a matching network connected to the switch node, and wherein:
the matching network functions such that, with the second transistor turned off and the second capacitor disconnected, as the first transistor turns on, a voltage at the switch node and a first time derivative of the voltage at the switch node are substantially zero.

* * * * *